(12) United States Patent
Hofer et al.

(10) Patent No.: US 10,249,723 B2
(45) Date of Patent: *Apr. 2, 2019

(54) SEMICONDUCTOR DEVICE (71) Applicant: Infineon Technologies Austria AG, Villach (AT)

(72) Inventors: Heimo Hofer, Bodensdorf (AT); Martin Poelzl, Ossiach (AT); Maximilian Roesch, St. Magdalen (AT); Britta Wutte, Feistritz (AT)

(73) Assignee: Infineon Technologies Austria AG, Villach (AT)

( * ) Notice: Subject to any disclaimer, the term of this patent is extended or adjusted under 35 U.S.C. 154(b) by 8 days.

This patent is subject to a terminal disclaimer.

(21) Appl. No.: 15/854,236

(22) Filed: Dec. 26, 2017

(65) Prior Publication Data

US 2018/0138278 A1    May 17, 2018

Related U.S. Application Data

(63) Continuation of application No. 15/405,987, filed on Jan. 13, 2017, now Pat. No. 9,859,385.

(51) Int. Cl.
| | |
|---|---|
| *H01L 21/763* | (2006.01) |
| *H01L 29/417* | (2006.01) |
| *H01L 29/40* | (2006.01) |
| *H01L 29/423* | (2006.01) |
| *H01L 29/78* | (2006.01) |

(Continued)

(52) U.S. Cl.
CPC ...... *H01L 29/41766* (2013.01); *H01L 29/407* (2013.01); *H01L 29/4236* (2013.01); *H01L 29/66348* (2013.01); *H01L 29/66734* (2013.01); *H01L 29/7397* (2013.01); *H01L 29/7825* (2013.01); *H01L 29/7834* (2013.01); *H01L 29/7813* (2013.01)

(58) Field of Classification Search
CPC ......... H01L 21/76879; H01L 27/10823; H01L 27/10876

See application file for complete search history.

(56) References Cited

U.S. PATENT DOCUMENTS

| | | | |
|---|---|---|---|
| 9,859,385 B2 * | 1/2018 | Hofer | ............... H01L 29/41766 |
| 2012/0161222 A1 | 6/2012 | Huang et al. | |
| 2013/0248861 A1 | 9/2013 | Wutte | |

FOREIGN PATENT DOCUMENTS

DE    102012102533 B3    8/2013

* cited by examiner

*Primary Examiner* — Mohammad Choudhry
(74) *Attorney, Agent, or Firm* — Murphy, Bilak & Homiller, PLLC (57) ABSTRACT

A semiconductor device includes a semiconductor body having a main surface and an active region surrounded by a non-active region. A trench extends from the main surface into the semiconductor body. The trench has a stripe configuration and extends laterally within the active region. A first electrode and a first insulator are in the trench. The first insulator insulates the first electrode from the semiconductor body. The first electrode is recessed in the trench and has a planar surface extending generally parallel with and below the main surface of the semiconductor body so as to define a well in the trench that is laterally confined by the first insulator. A second insulator is on the planar surface. A second electrode is within the well of the trench, and the second insulator insulates the second electrode from the first electrode.

20 Claims, 5 Drawing Sheets

(51) Int. Cl.
*H01L 29/66* (2006.01)
*H01L 29/739* (2006.01)

SEMICONDUCTOR DEVICE

TECHNICAL FIELD

This specification refers to embodiments of a semiconductor device. In particular, this specification refers to embodiments of a semiconductor device having a stripe cell trench configuration.

BACKGROUND

Many functions of modern devices in automotive, consumer and industrial applications, such as converting electrical energy and driving an electric motor or an electric machine, rely on semiconductor devices. For example, Insulated Gate Bipolar Transistors (IGBTs), Metal Oxide Semiconductor Field Effect Transistors (MOSFETs) and diodes, to name a few, have been used for various applications including, but not limited to switches in power supplies and power converters.

A semiconductor device is usually configured to conduct a load current along a load current path between two load terminals of the device. Further, the load current path may be controlled by means of a control electrode, sometimes referred to as gate electrode. For example, upon receiving a corresponding control signal from, e.g., a driver unit, the control electrode may set the semiconductor device in one of a conducting state and a blocking state.

The control electrode may be buried within a trench extending into a semiconductor body of the semiconductor device. Such configuration is usually referred to as trench gate configuration. The trenches may be implemented as so-called needle trenches that are distributed within a cell field of the semiconductor device. Alternatively, the trenches may be implemented in a so-called stripe configuration, wherein such stripe trenches may be arranged substantially in parallel to each other, each of such stripe trench extending laterally throughout substantially the entire active region bordering the non-active region of the semiconductor device that may surround the active region.

Occasionally, such stripe trench may house more than only one electrode, e.g., two electrodes, wherein the more than one electrodes may be insulated from each other and receive separate control signal.

To this end, both electrodes included within the stripe trench may need to be contacted such that the separate control signals may be provided to them. For example, such a configuration is referred to as dual-poly-trench-concept.

SUMMARY

According to an embodiment, a method of processing a semiconductor device is presented. The method comprises providing a semiconductor body; forming a trench within the semiconductor body; the trench having a stripe configuration and extending laterally within an active region of the semiconductor body that is surrounded by a non-active region of the semiconductor body; forming, within the trench, a first electrode and a first insulator insulating the first electrode from the semiconductor body; carrying out a first etching step for partially removing the first electrode along the total lateral extension of the first electrode such that the remaining part of the first electrode has a planar surface, thereby creating a well in the trench that is laterally confined by the first insulator; depositing a second insulator on top the planar surface; and forming a second electrode within the well of the trench, wherein the second insulator insulates the second electrode from the first electrode.

According to a further embodiment, a further method of processing a semiconductor device is presented. The further method comprises providing a semiconductor device that includes: a semiconductor body having a surface; a trench arranged within the semiconductor body, the trench having a stripe configuration and extending laterally within an active region of the semiconductor body that is surrounded by a non-active region of the semiconductor body; a first electrode and a first insulator arranged within the trench; the first insulator insulating the first electrode from the semiconductor body; and a second electrode and a second insulator arranged within the trench, the second insulator insulating the second electrode from the first electrode, wherein: the first electrode extends deeper within the trench than the second electrode and forms a well incorporating each of the second electrode and the second insulator; and at a first lateral termination area between the active region and the non-active region, each of the first electrode and the second electrode extend towards the surface such that they have both a common lateral extension range and a common vertical extension range. The further method includes forming a groove within the trench by etching, at the first lateral termination area, a lateral extremity of the second electrode, wherein said etching is selective to the second insulator.

Those skilled in the art will recognize additional features and advantages upon reading the following detailed description, and upon viewing the accompanying drawings.

BRIEF DESCRIPTION OF THE DRAWINGS

The parts in the figures are not necessarily to scale, instead emphasis being placed upon illustrating principles of the invention. Moreover, in the figures, like reference numerals designate corresponding parts. In the drawings.

DETAILED DESCRIPTION

In the following detailed description, reference is made to the accompanying drawings which form a part hereof and in which are shown by way of illustration specific embodiments in which the invention may be practiced.

In this regard, directional terminology, such as "top", "bottom", "below", "front", "behind", "back", "leading", "trailing", "below", "above" etc., may be used with reference to the orientation of the figures being described. Because parts of embodiments can be positioned in a number of different orientations, the directional terminology is used for purposes of illustration and is in no way limiting. It is to be understood that other embodiments may be utilized and structural or logical changes may be made without departing from the scope of the present invention. The following detailed description, therefore, is not to be taken in a limiting sense, and the scope of the present invention is defined by the appended claims.

Reference will now be made in detail to various embodiments, one or more examples of which are illustrated in the figures. Each example is provided by way of explanation, and is not meant as a limitation of the invention. For example, features illustrated or described as part of one embodiment can be used on or in conjunction with other embodiments to yield yet a further embodiment. It is intended that the present invention includes such modifications and variations. The examples are described using specific language which should not be construed as limiting the scope of the appended claims. The drawings are not scaled and are for illustrative purposes only. For clarity, the same elements or manufacturing steps have been designated by the same references in the different drawings if not stated otherwise.

The term "horizontal" as used in this specification intends to describe an orientation substantially parallel to a horizontal surface of a semiconductor substrate or of a semiconductor body. This can be for instance the surface of a semiconductor wafer or a die. For example, both the first lateral direction X and the second lateral direction Y mentioned below can be horizontal directions, wherein the first lateral direction X and the second lateral direction Y may be perpendicular to each other.

The term "vertical" as used in this specification intends to describe an orientation which is substantially arranged perpendicular to the horizontal surface, i.e., parallel to the normal direction of the surface of the semiconductor wafer. For example, the extension direction Z mentioned below may be a vertical direction that is perpendicular to both the first lateral direction X and the second lateral direction Y.

In this specification, n-doped is referred to as "first conductivity type" while p-doped is referred to as "second conductivity type". Alternatively, opposite doping relations can be employed so that the first conductivity type can be p-doped and the second conductivity type can be n-doped.

Further, within this specification, the term "dopant concentration" may refer to an average dopant concentration or, respectively, to a mean dopant concentration or to a sheet charge carrier concentration of a specific semiconductor region or semiconductor zone, such as a semiconductor region within a trench. Thus, e.g., a statement saying that a specific semiconductor region has a certain dopant concentration that is higher or lower as compared to a dopant concentration of another semiconductor region may indicate that the respective mean dopant concentrations of the semiconductor regions differ from each other.

In the context of the present specification, the terms "in ohmic contact", "in electric contact", "in ohmic connection", and "electrically connected" intend to describe that there is a low ohmic electric connection or low ohmic current path between two regions, sections, zones, portions or parts of a semiconductor device or between different terminals of one or more devices or between a terminal or a metallization or an electrode and a portion or part of a semiconductor device. Further, in the context of the present specification, the term "in contact" intends to describe that there is a direct physical connection between two elements of the respective semiconductor device; e.g., a transition between two elements being in contact with each other may not include a further intermediate element or the like.

In addition, in the context of the present specification, the term "electric insulation" is used, if not stated otherwise, in the context of its general valid understanding and thus intends to describe that two or more components are positioned separately from each other and that there is no ohmic connection connecting those components. However, components being electrically insulated from each other may nevertheless be coupled to each other, for example mechanically coupled and/or capacitively coupled and/or inductively coupled. To give an example, two electrodes of a capacitor may be electrically insulated from each other and, at the same time, mechanically and capacitively coupled to each other, e.g., by means of an insulation, e.g., a dielectric.

Specific embodiments described in this specification pertain to, without being limited thereto, a power semiconductor device having a stripe cell configuration, such as a power semiconductor transistor, that may be used within a power converter or a power supply. Thus, in an embodiment, the semiconductor device is configured for carrying a load current that is to be fed to a load and/or, respectively, that is provided by a power source. For example, the semiconductor device may comprise one or more active power semiconductor stripe cells, such as a monolithically integrated diode stripe cell, and/or a monolithically integrated transistor stripe cell, and/or a monolithically integrated IGBT stripe cell, and/or a monolithically integrated RC-IGBT stripe cell, and/or a monolithically integrated MOS Gated Diode (MGD) stripe cell, and/or a monolithically integrated MOSFET stripe cell and/or derivatives thereof. Such diode cell and/or such transistor cells may be integrated in a power semiconductor module. A plurality of such stripe cells may constitute a cell field of the power semiconductor device.

The term "power semiconductor device" as used in this specification intends to describe a semiconductor device on a single chip with high voltage blocking and/or high current-carrying capabilities. In other words, such power semiconductor device is intended for high current, typically in the Ampere range, e.g., up to several ten or hundred Ampere, and/or high voltages, typically above 15 V, more typically 100 V and above. For example, the processed semiconductor device described below may be a semiconductor device having a stripe cell configuration and arranged to be employed as a power component in a medium-voltage application.

Figure 1:
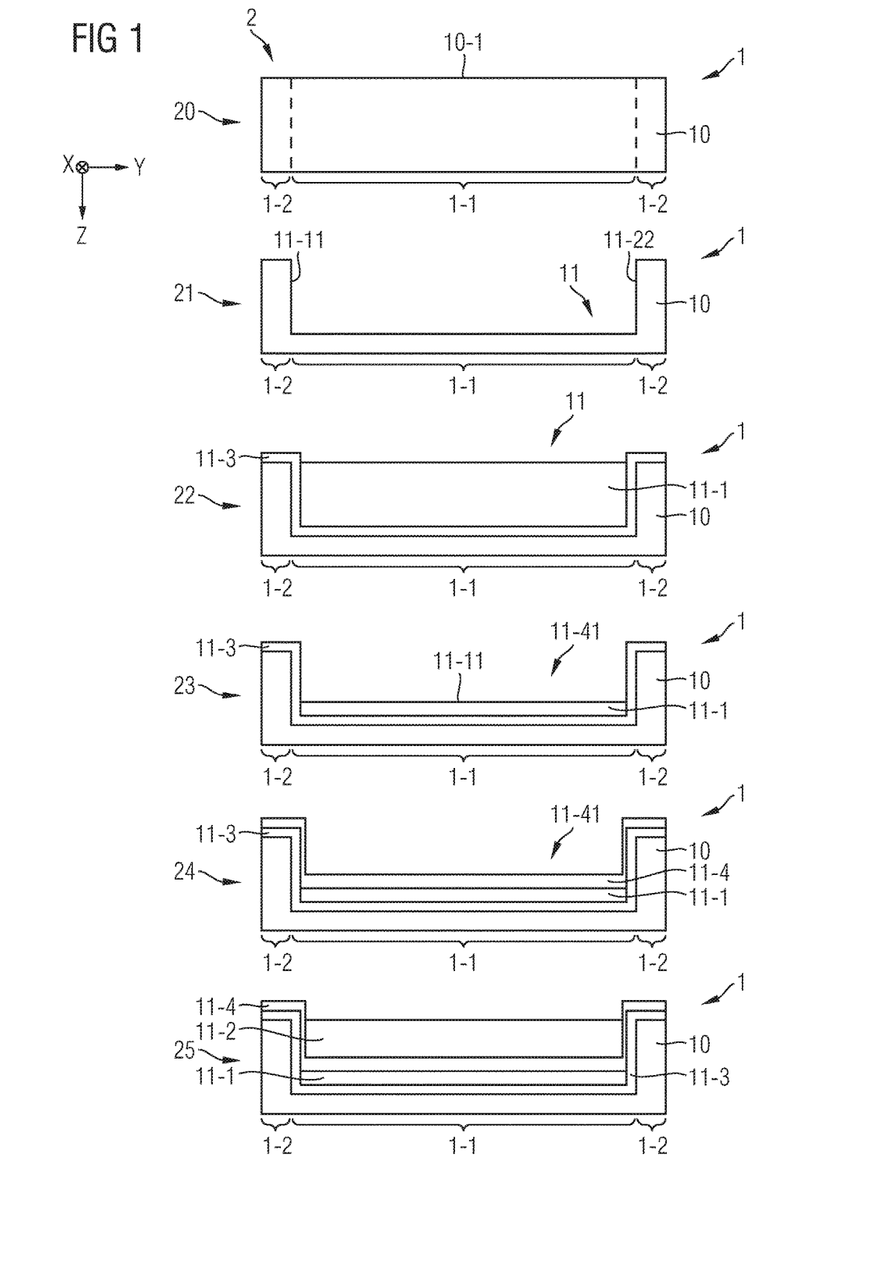
FIG. 1 schematically illustrates different stages of a semiconductor device processing method by means of a respective schematic illustration of a section of vertical-cross section of a semiconductor device in accordance with one or more embodiments.

FIG. 1 schematically illustrates different stages of a semiconductor device processing method 2 by means of a respective section of a vertical cross-section of a semiconductor device 1.

In the first step 20, a semiconductor body 10 is provided. The semiconductor body 10 may extend laterally in the first lateral direction X and the second lateral direction Y and may further extent vertically along a vertical direction Z that may be perpendicular to each of the first lateral direction X and the second lateral direction Y.

The semiconductor body 10 may comprise an active region 1-1 that shall later be used for conducting the load current. The active region 1-1 may be surrounded by a non-active region 1-2. For example, within the semiconductor device processing method 2, the active region 1-1 may be formed with a stripe cell field having of plurality of cells, such as diode cells and/or transistor cells, in order to provide for the load current carrying capability. Each stripe cell may have one or more doped semiconductor regions, such as a semiconductor region of the first conductivity type and/or a semiconductor region of a second conductivity type complementary to the first conductivity type. Such semiconductor regions may include, e.g., a source region, body region, a drift region and/or a compensation region. In an embodiment, the cells are not provided in the non-active region 1-2. However, means for contacting components of the cells of the active region 1-1 may be formed within the non-active region 1-2, as will be described in more detail below.

In an embodiment, the semiconductor body 10 may have surface 10-1 that may constitute a front side of the semiconductor device 1. For example, the surface 10-1 is subjected to the different processing steps of the semiconductor device processing method 2 described below. Thus, it shall be understood that a backside of the provided semiconductor device 1 may already have been processed and comprise, e.g., at backside metallization, such as a drain terminal. Also, parts of the semiconductor body 10 in proximity of the backside may have been processed before carrying out the processing steps described below. For example, the provided semiconductor body 10 may be equipped with a buffer layer (not shown) being in contact with the backside metallization (not shown), wherein the buffer layer may have a higher dopant concentration as compared to, e.g., the remaining semiconductor body 10 or, respectively, regions thereof, e.g., a semiconductor drift region (not shown).

After the semiconductor body 10 has been provided, a trench 11 may be formed within step 21. The trench 11 may extend into the semiconductor body 10 along the vertical direction Z and may have a stripe configuration that extends laterally along the second lateral direction Y within the active region 1-1 that is surrounded by the non-active region 1-2. For example, the trench 11 extends within the entire active region 1-1 through to the transition to the non-active region 1-2. For example, the total lateral extension of the trench 11 along the second lateral direction Y is a multiple of the total lateral extension of the trench 11 along the first lateral direction X.

In the following step 22, a first insulator 11-3 and a first electrode 11-1 may be formed within the trench 11. The first insulator 11-3 may be formed such that it insulates the first electrode 11-1 from the semiconductor body 10. For example, forming the first insulator 11-3 may be carried out by means of an oxidation step. The first insulator 11-3 may cover the entire bottom and the entire sidewalls of the trench 11. The first electrode 11-1 may be formed after the first insulator 11-3 has been formed and may comprise, e.g., a metal and/or a very highly doped semiconductor material, such as polysilicon.

As illustrated in FIG. 1, the first electrode 11-1 may extend throughout the total lateral extension of the trench 11, wherein at that processing stage, the total lateral extension of the trench 11 may be defined by the distance between the two trench sidewalls that are formed by the first insulator 11-3. Thus, forming the first electrode 11-1 may occur along the total lateral extension of the trench 11. To this end, forming the first electrode 11-1 may occur without using a lithographic mask with respect to the total lateral extension of the trench 11. For example, the first electrode 11-1 is not structured along the total lateral extension of the trench 11 in the second lateral direction Y.

In a next step 23, the first etching step may be carried out for partially removing the first electrode 11-1 along the total lateral extension of the first electrode 11-1 such that the remaining part of the first electrode 11-1 has a substantially planar surface 11-11. Thereby, a well 11-41 can be created within the trench 11 that is laterally confined by the first insulator 11-3. The first etching step may be selective to the first insulator 11-3; in other words, in an embodiment, the first insulator 11-3 or parts thereof is/are not removed during the first etching step.

Further, the first etching step may also occur without using a lithographic mask with respect to the applicable total lateral extension of the trench 11. Thus, in an embodiment, also the first etching step does not cause structuring of the first electrode 11-1 along the total lateral extension of the trench 11 in the second lateral direction Y.

After the first etching step, a second insulator 11-4 may be deposited on top the planar surface 11-11 (step 24). For example, said depositing of the second insulator 11-4 is carried out along the total lateral extension of the first electrode 11-1 in the second lateral direction Y within the trench 11. Thus, also depositing the second insulator 11-4 may occur without using a lithographic mask with respect to the applicable total lateral extension of the trench 11 along the second lateral direction Y. Thereby, the entire bottom of the well 11-41 may become evenly covered which the second insulator 11-3. In other words, during step 24, the entire first the electrode 11-1 is buried underneath the second insulator 11-4.

In an embodiment, depositing the second insulator 11-4 on top the planar surface 11-11 may occur only along the vertical direction Z that may be perpendicular to the planar surface 11-11. Thereby, it can be ensured that the sidewalls of the trench 11 (which may be substantially in parallel to the vertical direction Z) do not become exposed to the deposition, i.e., do not become covered by an additional insulation layer. For example, to this end, depositing the second insulator 11-4 may include carrying out a High-Density-Plasma (HDP) deposition. Nevertheless, FIG. 1 schematically illustrates presence of the second insulator 11-4 even at the sidewalls of the trench. However, in view of the aforesaid, it shall be understood that the sickness the second insulator 11-4 at the trench sidewalls may be substantially 0 and thus be negligible, in accordance with an embodiment.

Subsequently, a second electrode 11-2 may be formed within the well 11-41 of the trench 11, e.g., on top of the second insulator 11-4 (step 25). The second insulator 11-4 may ensure that the first electrode 11-1 is insulated from the second electrode 11-2. For example, forming the second electrode 11-2 occurs directly after depositing the second insulator 11-4, e.g., without carrying out a separate oxidation between steps 24 and 25. Further, forming the second electrode 11-2 within the well 11-41 can be carried out such that the entire second insulator 11-4 within the well 11-41 is buried underneath the second electrode 11-2.

Thus, the second electrode 11-2 may be formed after the second insulator 11-4 has been formed and may comprise, e.g., a metal and/or a very highly doped semiconductor material, such as polysilicon.

As described above, one or more or even each of the steps 22, 23, 24 and 25 may be carried out globally with respect to the total lateral extension of the trench 11 along the second lateral direction Y that is applicable during the respective processing step. For example, none of the first insulator 11-3, the first electrode 11-1, the second insulator 11-4 and the second electrode 11-2 is structured within the trench 11, but has a substantially planar termination in the vertical direction Z. Accordingly, use of a corresponding lithographic mask during said processing steps may be avoided.

Figure 2:
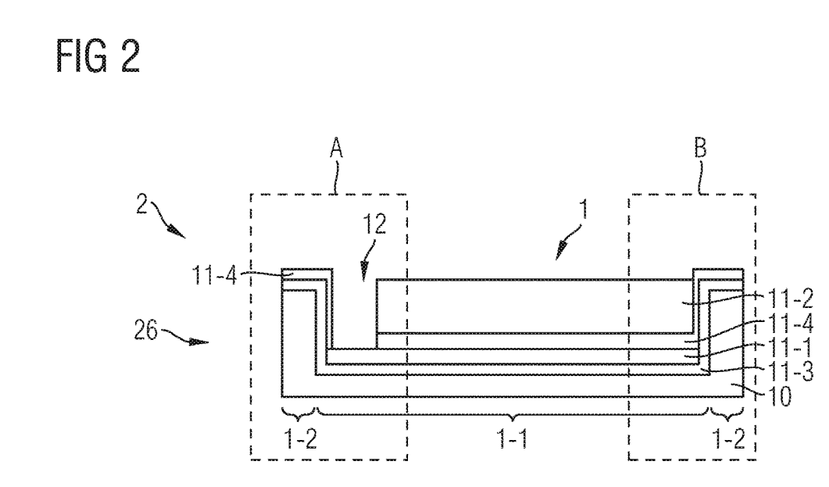
FIG. 2 schematically illustrates a further stage of a semiconductor device processing method by means of a schematic illustration of a section of vertical-cross section of a semiconductor device in accordance with one or more embodiments.

In a further embodiment of the method 2, a section of the second electrode 11-2 and a section of the second insulator 11-4 are removed for exposing a part of the first electrode 11-1 during step 26 schematically illustrated in FIG. 2. Thereby, a first contact groove 12 for contacting the first electrode 11-1 may be created, the first contact groove 12 being laterally confined by each of the second electrode 11-2 and the second insulator 11-4 on the one side and at least one of the first insulator 11-3 and the second insulator 11-4 on the other side. Depending on the manner of depositing the second insulator within step 24, the first contact groove 12 can also be laterally confined by only the first insulator 11-3 on the other side (left side in FIG. 2), e.g., if said HDP deposition is applied only along the vertical direction Z.

Removing the section of the second electrode) 1-2 and the section of the second insulator 11-4 for exposing the part of the first electrode 11-1 arranged below said sections may include carrying out a lithographic processing step. Thus, creating the contact groove 12 does not occur along the entire total lateral extension of the trench 11, in accordance with one or more embodiments. The first contact groove 12 can be created in order to provide for the possibility to electrically contact the first electrode 11-1 that was previously entirely buried underneath the second insulator 11-4 and the second electrode 11-2, e.g., by means of a plug or the like, which will now be explained in more detail.

Figure 3:
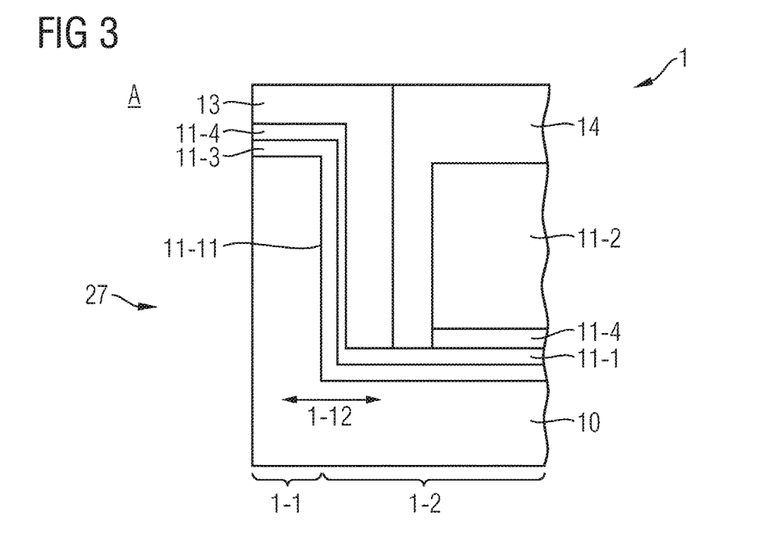
FIG. 3 schematically illustrates a further stage of a semiconductor device processing method by means of a schematic illustration of a section of vertical-cross section of a semiconductor device in accordance with one or more embodiments.

In an embodiment of the method 2, a further step 27 schematically illustrated in FIG. 3 is carried out, during which a first contact structure 13 and a first insulation structure 14 are provided that both extend into the first contact groove 12, wherein the first contact structure 13 electrically contacts the first electrode 11-1 and is electrically insulated from the second electrode 11-2 by means of the first insulation structure 14.

Further, the first contact structure 13 may be provided such that it extends out of the trench 11 into the non-active region 1-2 of the semiconductor body 10 and is configured to receive a first control signal from external of the semiconductor body 10. To give an example, the first contact structure 13 may extend above the surface 10-1 of the semiconductor body 10 and may comprise a first contact runner arranged within the non-active region 1-2, which will be explained in more detail with respect to FIG. 6.

In an example, the trench 11 formed in processing step 21 has a first lateral end 11-11, which may be formed by one sidewall of the trench 11, wherein the first lateral end 11-11 defines a first lateral termination area 1-12 between the active region 1-1 and the non-active region 1-2, as schematically illustrated in FIG. 3. For example, the first contact groove 12 is formed at said first lateral termination area 1-12.

Figure 4:
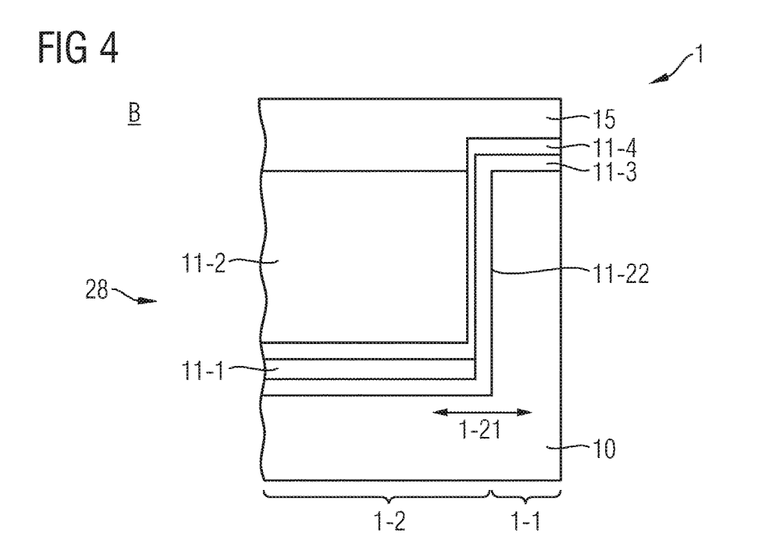
FIG. 4 schematically illustrates a further stage of a semiconductor device processing method by means of a schematic illustration of a section of vertical-cross section of a semiconductor device in accordance with one or more embodiments.

Further, the trench 11 formed in processing step 21 may have a second lateral end 11-22, which may be formed by the other one of the sidewalls of the trench 11, wherein the second lateral end 11-22 defines a second lateral termination area 1-21 between the active region 1-1 and the non-active region 1-2, a schematically illustrated in FIG. 4. In an embodiment, method 2 comprises providing, in step 28, a second contact structure 15 that electrically contacts the second electrode 11-2 and extends out of the trench 11 into the non-active region 1-2 of the semiconductor body 10 and is configured to receive a second control signal from external the semiconductor body 10. The second control signal may be different from the first control signal.

For example, the first electrode 11-1 that may receive the first control signal may form a compensation electrode of the semiconductor device 1. To this end, the first contact structure 13 may be electrically connected to a first load terminal (not shown) of the semiconductor device 1, e.g., to a source terminal of the semiconductor device 1. Thus, in an embodiment, the first electrode 11-1 may be configured to receive a source potential by means of the first contact structure 13.

Further, the second electrode 11-2 that may receive the second control signal may form a control electrode of the semiconductor device 1, e.g., a gate electrode that may be configured to control the load current path introductorily mentioned above. Such control of the load current path may occur, e.g., by means of inducing an inversion channel within said semiconductor body region that may be present within the semiconductor body 10. Thus, the second electrode 11-2 may be configured to set the semiconductor device 1 in one of a conducting state and a blocking state.

However, it shall be understood that the present embodiments are not limited to this exemplary configuration. For example, in other embodiments, each of the first electrode 11-1 and the second electrode 11-2 receive the same control signal or, respectively, control signals different from a gate control signal or a source potential.

Figure 6:
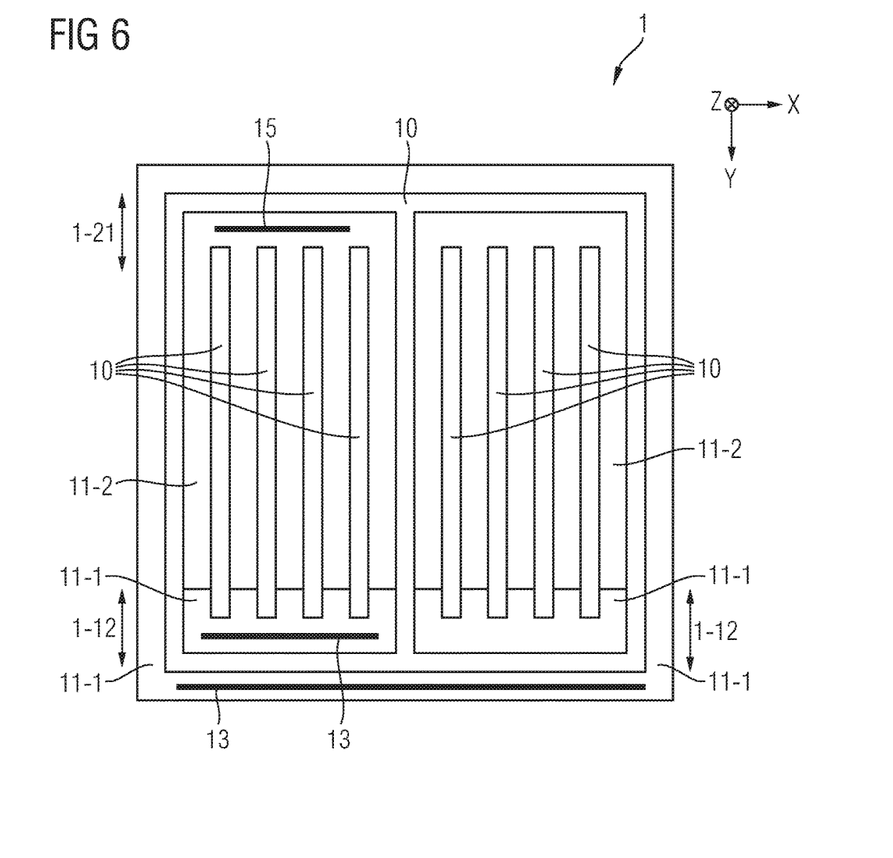
FIG. 6 schematically illustrates a section of a horizontal projection of a semiconductor device in accordance with one or more embodiments.

Carrying out one or more of the examples of the method 2 described above may allow for implementing a chip layout as schematically illustrated in FIG. 6, which will now be discussed in more detail.

FIG. 6 schematically illustrates a section of a horizontal projection of a semiconductor device 1 in accordance with one or more embodiments. Said horizontal projection may be in parallel to each of the first lateral direction X and the second lateral direction Y and perpendicular to the vertical direction Z. FIG. 6 shows several depth levels and not a strict horizontal cross-section of the semiconductor device 1.

For example, the semiconductor device 1 shown in FIG. 6 has been processed in accordance with one or more of the embodiments of the method 2 described above. The semiconductor device 1 includes several trenches 11 in a stripe configuration and that are spaced apart from each other by means of respective sections of the semiconductor body 10. Each of the trenches 11 includes a respective first electrode 11-1 and a respective second electrode 11-2.

As illustrated, said first contact structure 13 may establish electrical connection to the first control electrode 11-1 in the first lateral termination area 1-12. To this end, the first contact structure 13 may comprise one or more first contact runners arranged, e.g., substantially perpendicular to the total lateral extensions of the trenches 11 along the second lateral direction Y.

At the other lateral termination area, i.e., the second lateral termination area 1-21, the second contact structure 15 may establish electrical connection to the second electrode 11-2. To this end, also the second contact structure 15 may comprise one or more second contact runners arranged, e.g., substantially perpendicular to the total lateral extensions of the trenches 11 along the second lateral direction Y.

Figure 5:
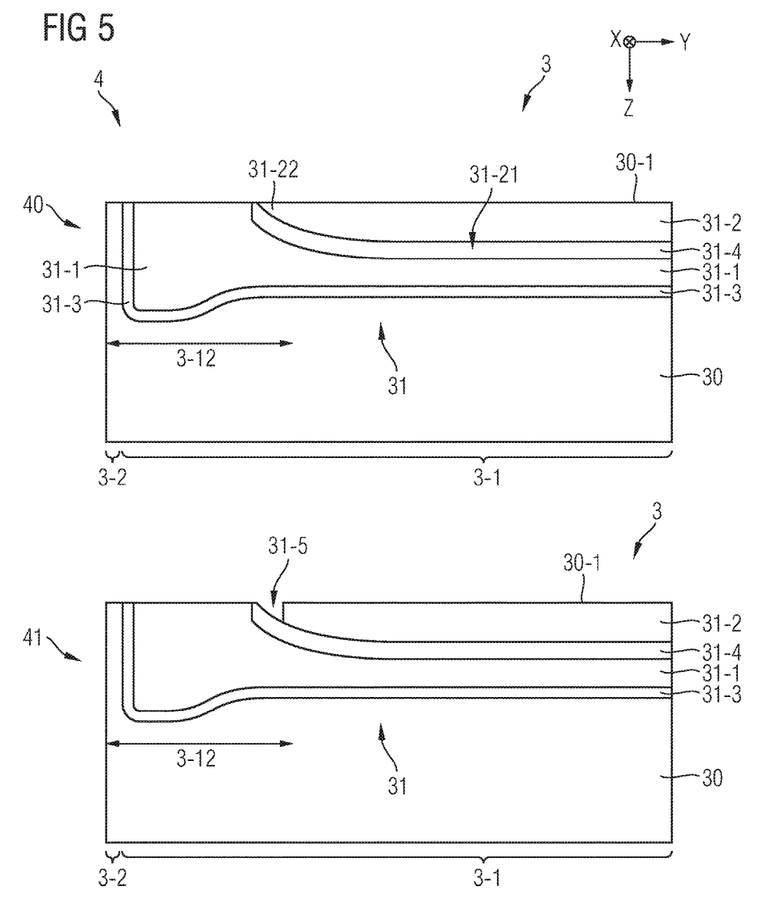
FIG. 5 schematically illustrates different stages of a semiconductor device processing method by means of a respective schematic illustration of a section of vertical-cross section of a semiconductor device in accordance with one or more embodiments.

FIG. 5 schematically illustrates different stages of a semiconductor device processing method 4 by means of a respective schematic illustration of a section of vertical-cross section of a semiconductor device 3 in accordance with one or more embodiments. In an embodiment, also carrying out method 4 may allow for implementing a chip layout as schematically illustrated in FIG. 6 discussed above.

In a first step 40, a semiconductor device 3 is provided. The semiconductor device 3 includes a semiconductor body 30 having a surface 30-1. What has been stated above respect to the semiconductor body 10 of the semiconductor device 1 may equally apply to the semiconductor 30 of the semiconductor device 3, if not stated otherwise.

A trench 31 is arranged within the provided semiconductor body 30, wherein the trench 31 has a stripe configuration and extends laterally within an active region 3-1 of the semiconductor body 30 that is surrounded by a non-active region 3-2 of the semiconductor body 30. Again, what has been stated above respect to the active region 1-1 and the non-active region 1-2 of the semiconductor body 10 may equally apply to the respective regions of the semiconductor body 30.

A first electrode 31-1 and a first insulator 31-3 are arranged within the trench 31, wherein the first insulator 31-3 insulates the first electrode 31-1 from the semiconductor body 30.

Further, a second electrode 31-2 and a second insulator 31-4 are arranged within the trench 31, wherein the second insulator 31-4 insulates the second electrode 31-2 from the first electrode 31-1.

The first electrode 31-1 extends deeper within the trench 31 than the second electrode 31-2 and forms a well 31-21 incorporating each of the second electrode 31-2 and the second insulator 31-4.

For example, the first electrode 31-1 may form a compensation electrode and the second electrode 31-2 may form a control electrode, e.g. a gate electrode, of the semiconductor device 3.

At a first lateral termination area 3-12 between the active region 3-1 and the non-active region 3-2, each of the first electrode 31-1 and the second electrode 31-2 extend towards the surface 30-1 such that they have both a common lateral extension range and a common vertical extension range.

Establishing the structure of the semiconductor device 3 as elucidated above with respect to method step 40 illustrated in FIG. 5 is a known measure to the skilled person and shall, thus, not be explained in more detail within this specification.

In a next step 41, a groove 31-5 is formed within the trench 31 by etching, at the first lateral termination area 3-12, a lateral extremity 31-22 of the second electrode 31-2, wherein said etching can be selective to the second insulator 31-4. Thus, during the step 41, the second insulator 31-4 or, respectively, parts thereof, are not removed, in accordance with one or more embodiments. Forming the groove 31-5 may include carrying out a lithographic processing step.

The thickness of the second insulator 31-4 arranged between the first electrode 31-1 and the second electrode 31-2 may vary along a lateral direction Y and may have a minimum at the lateral extremity 31-22 of the second electrode 31-2, prior to carrying out said etching within step 41. Thus, at the first lateral termination area 3-12, due to the "pulled-up" electrodes 31-1 and 31-2, the insulation between the electrodes 31-1 and 31-2 can be comparatively poor prior to forming of the groove 31-5 in step 41.

In an embodiment, method 4 includes filling the groove 31-5 with a third insulator (not illustrated). Thereby, the effective insulation thickness between the first electrode 31-1 and the second electrode 31-2 may be increased at the first lateral termination area 3-12.

Filling the groove 31-5 with the third insulator may comprise, e.g., one of the following: a HPD deposition, a tetraethyl orthosilicate (TEOS) deposition, an undoped silicon glass (USG) deposition, a borophosphosilicate glass (PBSG) deposition or the like.

From the aforesaid, it becomes apparent that also in accordance with one or more embodiments of the method 4, a chip layout may be implemented as schematically illustrated in FIG. 6. Thus, a first contact structure (cf. reference sign 13 in FIG. 6) extending into the non-active region 3-2 may be provided for contacting the first electrode 31-1 at the first lateral termination area 3-12, and a second contact structure (cf. reference sign 15 in FIG. 6) may be provided at the other lateral termination area (not shown in FIG. 5) for contacting the second electrode 31-2.

In the above, embodiments pertaining to semiconductor device processing methods were explained. For example, these semiconductor devices are based on silicon (Si). Accordingly, a monocrystalline semiconductor region or layer, e.g., the semiconductor region 10 of exemplary embodiments, can be a monocrystalline Si-region or Si-layer. In other embodiments, polycrystalline or amorphous silicon may be employed.

It should, however, be understood that the semiconductor region 10 or, respectively, parts thereof can be made of any semiconductor material suitable for manufacturing a semiconductor device. Examples of such materials include, without being limited thereto, elementary semiconductor materials such as silicon (Si) or germanium (Ge), group IV compound semiconductor materials such as silicon carbide (SiC) or silicon germanium (SiGe), binary, ternary or quaternary III-V semiconductor materials such as gallium nitride (GaN), gallium arsenide (GaAs), gallium phosphide (GaP), indium phosphide (InP), indium gallium phosphide (InGaPa), aluminum gallium nitride (AlGaN), aluminum indium nitride (AlInN), indium gallium nitride (InGaN), aluminum gallium indium nitride (AlGaInN) or indium gallium arsenide phosphide (InGaAsP), and binary or ternary II-VI semiconductor materials such as cadmium telluride (CdTe) and mercury cadmium telluride (HgCdTe) to name few. The aforementioned semiconductor materials are also referred to as "homojunction semiconductor materials". When combining two different semiconductor materials a heterojunction semiconductor material is formed. Examples of heterojunction semiconductor materials include, without being limited thereto, aluminum gallium nitride (AlGaN)-aluminum gallium indium nitride (AlGaInN), indium gallium nitride (InGaN)-aluminum gallium indium nitride (AlGaInN), indium gallium nitride (InGaN)-gallium nitride (GaN), aluminum gallium nitride (AlGaN)-gallium nitride (GaN), indium gallium nitride (InGaN)-aluminum gallium nitride (AlGaN), silicon-silicon carbide ($Si_xC_{1-x}$) and silicon-SiGe heterojunction semiconductor materials. For power semiconductor devices applications currently mainly Si, SiC, GaAs and GaN materials are used.

Spatially relative terms such as "under", "below", "lower", "over", "upper" and the like, are used for ease of description to explain the positioning of one element relative to a second element. These terms are intended to encompass different orientations of the respective device in addition to different orientations than those depicted in the figures. Further, terms such as "first", "second", and the like, are also used to describe various elements, regions, sections, etc. and are also not intended to be limiting. Like terms refer to like elements throughout the description.

As used herein, the terms "having", "containing", "including", "comprising", "exhibiting" and the like are open ended terms that indicate the presence of stated elements or features, but do not preclude additional elements or features. The articles "a", "an" and "the" are intended to include the plural as well as the singular, unless the context clearly indicates otherwise.

With the above range of variations and applications in mind, it should be understood that the present invention is not limited by the foregoing description, nor is it limited by the accompanying drawings. Instead, the present invention is limited only by the following claims and their legal equivalents.

What is claimed is:

1. A semiconductor device, comprising:
a semiconductor body having a main surface and an active region surrounded by a non-active region;
a trench extending from the main surface into the semiconductor body, the trench having a stripe configuration and extending laterally within the active region;
a first electrode and a first insulator in the trench, the first insulator insulating the first electrode from the semiconductor body, the first electrode being recessed in the trench and having a planar surface extending generally parallel with and below the main surface of the semiconductor body so as to define a well in the trench that is laterally confined by the first insulator;
a second insulator on the planar surface; and
a second electrode within the well of the trench, the second insulator insulating the second electrode from the first electrode.

2. The semiconductor device of claim 1, wherein the entire first electrode is buried underneath the second insulator.

3. The semiconductor device of claim 1, wherein the entire second insulator within the well is buried underneath the second electrode.

4. The semiconductor device of claim 1, further comprising a first contact groove in the trench and extending to the first electrode.

5. The semiconductor device of claim 4, wherein the first contact groove is laterally confined by each of the second electrode and the second insulator on a first side and by at least one of the first insulator and the second insulator on a second side opposite the first side.

6. The semiconductor device of claim 4, further comprising a first contact structure and a first insulation structure in the first contact groove, wherein the first contact structure contacts the first electrode and is electrically insulated from the second electrode by the first insulation structure.

7. The semiconductor device of claim 6, wherein the first contact structure extends out of the trench and over the non-active region of the semiconductor body and is configured to receive a first control signal from external of the semiconductor body.

8. The semiconductor device of claim 6, further comprising a second contact structure that electrically contacts the second electrode and extends out of the trench and over the non-active region of the semiconductor body and is configured to receive a second control signal from external of the semiconductor body.

9. The semiconductor device of claim 8, wherein the trench has a first lateral end and a second lateral end, wherein the first lateral end defines a first lateral termination area between the active region and the non-active region, wherein the second lateral end defines a second lateral termination area between the active region and the non-active region, wherein the first contact structure is provided at the first lateral termination area, and wherein the second contact structure is provided at the second lateral termination area.

10. The semiconductor device of claim 1, wherein the first electrode forms a compensation electrode and the second electrode forms a control electrode of the semiconductor device.

11. The semiconductor device of claim 1, wherein at a first lateral termination area between the active region and the non-active region, the first electrode and the second electrode each extend towards the main surface of the semiconductor body such that the first electrode and the second electrode have a common lateral extension range and a common vertical extension range.

12. The semiconductor device of claim 11, further comprising a groove formed in a lateral extremity of the second electrode at the first lateral termination area.

13. The semiconductor device of claim 12, wherein the groove extends to a depth within the semiconductor body below the main surface and terminates at or within the second insulator.

14. The semiconductor device of claim 12, wherein the groove is filled with a third insulator so that an effective insulation thickness between the first electrode and the second electrode is increased at the first lateral termination area.

15. The semiconductor device of claim 11, wherein a thickness of the second insulator arranged between the first electrode and the second electrode varies along a lateral direction and has a minimum at a lateral extremity of the second electrode at the first lateral termination area.

16. The semiconductor device of claim 11, wherein the first electrode forms a compensation electrode and the second electrode forms a gate electrode of the semiconductor device.

17. The semiconductor device of claim 11, wherein a depth of the trench from the main surface of the semiconductor body increases in the first lateral termination area.

18. A semiconductor device, comprising:
a semiconductor body having a main surface and an active region surrounded by a non-active region;
a trench within the semiconductor body and extending laterally within the active region of the semiconductor body;
a first electrode and a first insulator within the trench, the first insulator insulating the first electrode from the semiconductor body; and
a second electrode and a second insulator within the trench, the second insulator insulating the second electrode from the first electrode,
wherein the first electrode extends deeper in the trench than the second electrode and forms a well incorporating each of the second electrode and the second insulator,
wherein at a first lateral termination area between the active region and the non-active region, each of the first electrode and the second electrode extend towards the main surface such that the first electrode and the second electrode have a common lateral extension range and a common vertical extension range.

19. The semiconductor device of claim 18, further comprising a groove formed in a lateral extremity of the second electrode at the first lateral termination area, wherein the groove extends to a depth within the semiconductor body below the main surface and terminates at or within the second insulator.

20. A semiconductor device, comprising:
a semiconductor body having a surface;
a trench arranged within the semiconductor body, the trench having a stripe configuration and extending laterally within an active region of the semiconductor body that is surrounded by a non-active region of the semiconductor body;
a first electrode and a first insulator arranged within the trench, the first insulator insulating the first electrode from the semiconductor body; and
a second electrode and a second insulator arranged within the trench, the second insulator insulating the second electrode from the first electrode,
wherein the first electrode extends deeper within the trench than the second electrode and forms a well incorporating each of the second electrode and the second insulator,
wherein at a first lateral termination area between the active region and the non-active region, each of the first electrode and the second electrode extend towards the surface such that the first electrode and the second electrode have a common lateral extension range and a common vertical extension range,
wherein a groove is formed in a lateral extremity of the second electrode, at the first lateral termination area.

* * * * *